(12) United States Patent
Park et al.

(10) Patent No.: US 9,035,311 B2
(45) Date of Patent: May 19, 2015

(54) ORGANIC LIGHT EMITTING DIODE DISPLAY DEVICE AND METHOD OF FABRICATING THE SAME

(71) Applicant: Samsung Display Co., Ltd., Yongin (KR)

(72) Inventors: Byoung-Keon Park, Yongin (KR); Tae-Hoon Yang, Yongin (KR); Jin-Wook Seo, Yongin (KR); Soo-Beom Jo, Yongin (KR); Dong-Hyun Lee, Yongin (KR); Kil-Won Lee, Yongin (KR); Maxim Lisachenko, Yongin (KR); Yun-Mo Chung, Yongin (KR); Bo-Kyung Choi, Yongin (KR); Jong-Ryuk Park, Yongin (KR); Ki-Yong Lee, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 138 days.

(21) Appl. No.: 13/841,121

(22) Filed: Mar. 15, 2013

(65) Prior Publication Data

US 2013/0228760 A1 Sep. 5, 2013

Related U.S. Application Data

(62) Division of application No. 12/713,846, filed on Feb. 26, 2010, now Pat. No. 8,409,887.

(30) Foreign Application Priority Data

Mar. 3, 2009 (KR) .................. 10-2009-0018200

(51) Int. Cl.
  *H01L 29/12* (2006.01)
  *H01L 29/786* (2006.01)
  (Continued)

(52) U.S. Cl.
  CPC .......... *H01L 51/52* (2013.01); *H01L 27/3265* (2013.01); *H01L 2227/323* (2013.01)

(58) Field of Classification Search
  USPC .............. 257/40, 52, 53, 57, 59, 64–75, 184, 257/192, 291, E51.005, E21.053, E27.001, 257/E27.13, E27.111, E27.116, E27.117; 349/43, 48, 56, 58, 69, 153, 155, 156, 349/FOR. 124; 345/36, 44–46, 55, 76, 87, 345/92; 438/28–30, 34, 66, 69, 75, 82, 96, 438/99, 128, 135; 445/25; 313/483
  See application file for complete search history.

(56) References Cited

U.S. PATENT DOCUMENTS

| | | |
|---|---|---|
| 5,517,037 A | 5/1996 | Yamamoto |
| 5,814,540 A | 9/1998 | Takemura et al. |

(Continued)

FOREIGN PATENT DOCUMENTS

| | | |
|---|---|---|
| CN | 1779985 | 5/2006 |
| EP | 0763765 | 3/1997 |

(Continued)

OTHER PUBLICATIONS

Final Office Action for related U.S. Appl. No. 12/714,201 dated Jan. 17, 2013.

(Continued)

*Primary Examiner* — Meiya Li
(74) *Attorney, Agent, or Firm* — H.C. Park & Associates, PLC

(57) ABSTRACT

An organic light emitting diode (OLED) display device and a method of fabricating the same are provided. The OLED display device includes a substrate having a thin film transistor region and a capacitor region, a buffer layer disposed on the substrate, a gate insulating layer disposed on the substrate, a lower capacitor electrode disposed on the gate insulating layer in the capacitor region, an interlayer insulating layer disposed on the substrate, and an upper capacitor electrode disposed on the interlayer insulating layer and facing the lower capacitor electrode, wherein regions of each of the buffer layer, the gate insulating layer, the interlayer insulating layer, the lower capacitor electrode, and the upper capacitor electrode have surfaces in which protrusions having the same shape as grain boundaries of the semiconductor layer are formed. The resultant capacitor has an increased surface area, and therefore, an increased capacitance.

16 Claims, 6 Drawing Sheets

(51) Int. Cl.
*H01L 51/52* (2006.01)
*H01L 27/32* (2006.01)

(56) References Cited

U.S. PATENT DOCUMENTS

| | | | |
|---|---|---|---|
| 5,818,083 | A | 10/1998 | Ito |
| 6,198,133 | B1 | 3/2001 | Yamazaki et al. |
| 6,294,442 | B1 | 9/2001 | Kamal |
| 6,294,815 | B1 | 9/2001 | Yamazaki et al. |
| 6,703,266 | B1 | 3/2004 | Chen et al. |
| 6,806,099 | B2 | 10/2004 | Takeda et al. |
| 6,812,473 | B1 | 11/2004 | Amemiya |
| 6,927,107 | B1 | 8/2005 | Makita et al. |
| 7,015,501 | B2 | 3/2006 | Redecker et al. |
| 7,091,519 | B2 | 8/2006 | Yamazaki et al. |
| 7,341,907 | B2 | 3/2008 | Li et al. |
| 7,615,421 | B2 | 11/2009 | Lee et al. |
| 7,618,852 | B2 | 11/2009 | Jang et al. |
| 2001/0003659 | A1 | 6/2001 | Aya et al. |
| 2002/0063261 | A1 | 5/2002 | Zhang |
| 2003/0080337 | A1 | 5/2003 | Yudasaka et al. |
| 2004/0004597 | A1* | 1/2004 | Kung et al. ............ 345/106 |
| 2004/0115906 | A1 | 6/2004 | Makita et al. |
| 2004/0173796 | A1 | 9/2004 | Miyasaka |
| 2005/0023531 | A1 | 2/2005 | Shoji et al. |
| 2005/0161742 | A1 | 7/2005 | Isobe et al. |
| 2005/0184290 | A1 | 8/2005 | Ohnuma |
| 2005/0275019 | A1 | 12/2005 | Seo et al. |
| 2006/0040429 | A1 | 2/2006 | Park et al. |
| 2006/0051914 | A1 | 3/2006 | Kakehata et al. |
| 2006/0061266 | A1 | 3/2006 | Kang et al. |
| 2006/0121651 | A1 | 6/2006 | Park et al. |
| 2006/0130939 | A1 | 6/2006 | Jang et al. |
| 2007/0238229 | A1 | 10/2007 | Chang et al. |
| 2008/0111135 | A1* | 5/2008 | Choi et al. ............. 257/71 |
| 2008/0157083 | A1 | 7/2008 | Park et al. |
| 2008/0211024 | A1 | 9/2008 | Kato et al. |
| 2008/0258186 | A1 | 10/2008 | Surdeanu et al. |
| 2009/0050894 | A1 | 2/2009 | Park et al. |
| 2009/0239352 | A1 | 9/2009 | Kitagawa et al. |
| 2010/0224882 | A1 | 9/2010 | Lee et al. |

FOREIGN PATENT DOCUMENTS

| | | |
|---|---|---|
| EP | 1 903 604 | 3/2008 |
| EP | 2 226 833 | 9/2010 |
| JP | 63-033868 | 2/1988 |
| JP | 63-304668 | 12/1988 |
| JP | 01-102525 | 4/1989 |
| JP | 05-173177 | 7/1993 |
| JP | 06-067203 | 3/1994 |
| JP | 06-260651 | 9/1994 |
| JP | 07-013196 | 1/1995 |
| JP | 08-045850 | 2/1996 |
| JP | 09-107100 | 4/1997 |
| JP | 2001-189275 | 7/2001 |
| JP | 2001-337348 | 12/2001 |
| JP | 2003-060209 | 2/2003 |
| JP | 2003-100629 | 4/2003 |
| JP | 2003-115457 | 4/2003 |
| JP | 2003-188098 | 7/2003 |
| JP | 2004-207298 | 7/2004 |
| JP | 2005-064487 | 3/2005 |
| JP | 2005-229096 | 8/2005 |
| JP | 2005-354028 | 12/2005 |
| JP | 2006-019682 | 1/2006 |
| JP | 2006-024881 | 1/2006 |
| JP | 2006-330736 | 12/2006 |
| JP | 2007-013145 | 1/2007 |
| JP | 2007-027202 | 2/2007 |
| JP | 2007-035812 | 2/2007 |
| JP | 2007-073953 | 3/2007 |
| JP | 2007-193313 | 8/2007 |
| JP | 2007-311767 | 11/2007 |
| JP | 2008-166698 | 7/2008 |
| JP | 2008-166703 | 7/2008 |
| JP | 2008-166785 | 7/2008 |
| JP | 2009-059940 | 3/2009 |
| KR | 10-1997-0063763 | 9/1997 |
| KR | 10-1997-0072491 | 11/1997 |
| KR | 10-2000-0055877 | 9/2000 |
| KR | 10-0285865 | 3/2001 |
| KR | 10-2001-0078788 | 8/2001 |
| KR | 10-0317638 | 12/2001 |
| KR | 10-2002-0021546 | 3/2002 |
| KR | 10-2003-0028696 | 4/2003 |
| KR | 10-2004-0035409 | 4/2004 |
| KR | 10-2004-0036761 | 5/2004 |
| KR | 10-2004-0040762 | 5/2004 |
| KR | 10-2004-0098958 | 11/2004 |
| KR | 10-0470274 | 2/2005 |
| KR | 10-2006-0018533 | 3/2006 |
| KR | 10-2006-0058934 | 6/2006 |
| KR | 10-0623228 | 9/2006 |
| KR | 10-0628989 | 9/2006 |
| KR | 10-0772347 | 10/2007 |
| KR | 10-2007-0107142 | 11/2007 |
| KR | 10-2007-0107168 | 11/2007 |
| KR | 10-0778781 | 11/2007 |
| KR | 10-0839735 | 6/2008 |
| KR | 10-2008-0086967 | 9/2008 |
| TW | 361694 | 6/1999 |
| TW | I296855 | 5/2008 |
| TW | I305681 | 1/2009 |
| TW | I307961 | 3/2009 |

OTHER PUBLICATIONS

Non-Final Office Action for related U.S. Appl. No. 12/714,201 dated Sep. 27, 2012.
Final Office Action for related U.S. Appl. No. 12/713,928 dated Sep. 20, 2012.
Non-Final Office Action for related U.S. Appl. No. 12/713,928 dated Mar. 28, 2012.
Final Office Action for related U.S. Appl. No. 12/714,154 dated Apr. 10, 2012.
Final Office Action for related U.S. Appl. No. 12/714,137 dated Mar. 22, 2012.
*Ex Parte Quayle* Action for related U.S. Appl. No. 12/714,252 dated May 9, 2011.
Final Office Action for related U.S. Appl. No. 12/714,201 dated Apr. 24, 2012.
Non-Final Office Action for related U.S. Appl. No. 12/714,154 dated Dec. 23, 2011.
Non-Final Office Action for related U.S. Appl. No. 12/714,137 dated Dec. 19, 2011.
Final Office Action for related U.S. Appl. No. 12/713,928 dated Jul. 10, 2012.
Soo Young Yoon et al., "Metal-induced crystallization of amorphous silicon," Thin Solid Films 383 (2001), pp. 34-38.
Notice of Allowance and Fee(s) Due for related U.S. Appl. No. 12/714,252 dated Aug. 30, 2011.
Non-Final Office Action for related U.S. Appl. No. 12/714,201 dated Jan. 13, 2012.
S. L. Gras et al., "Intelligent Control of Surface Hydrophobicity," ChemphyChem, vol. 8, Oct. 2007, Wiley-VCH, Germany, pp. 2036-2050.
Non-Final Office Action for related U.S. Appl. No. 12/713,846 dated Aug. 27, 2012.
Notice of Allowance and Fee(s) Due for related U.S. Appl. No. 12/713,846 dated Dec. 14, 2012.
Non-Final Office Action for related U.S. Appl. No. 12/712,591 dated Feb. 28, 2013.
Non-Final Office Action issued on Feb. 26, 2014 in U.S. Appl. No. 12/714,154.
Final Office Action issued on Oct. 17, 2013 in U.S. Appl. No. 12/714,154.
Final Office Action issued on Jul. 24, 2013 in U.S. Appl. No. 12/712,591.

(56) References Cited

OTHER PUBLICATIONS

Final Office Action issued on Mar. 12, 2014 in U.S. Appl. No. 12/714,201.
European Extended Search Report issued on Mar. 4, 2014 in European Application No. 10154502.8.
Notice of Allowance issued on May 24, 2013 in U.S. Appl. No. 13/177,936.
Non-Final Office Action issued on Jul. 5, 2013 in U.S. Appl. No. 12/714,154.
Non-Final Office Action dated Dec. 3, 2013 in U.S. Appl. No. 12/714,201.

* cited by examiner

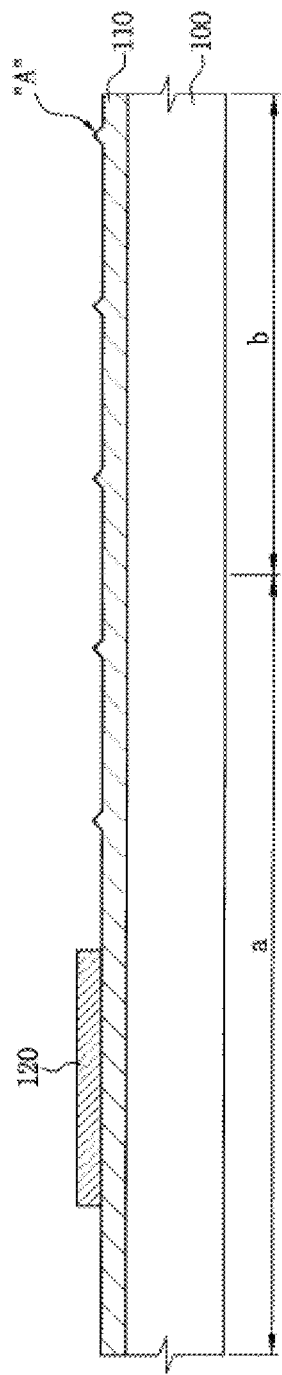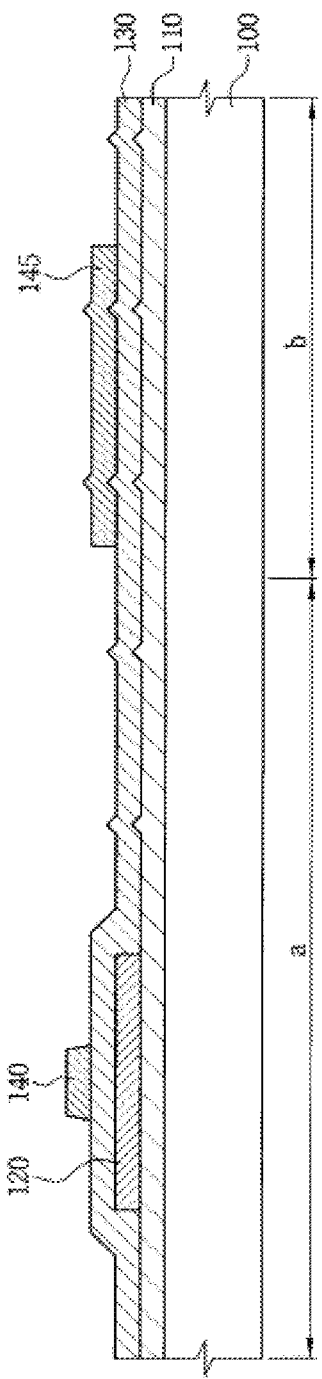

ORGANIC LIGHT EMITTING DIODE DISPLAY DEVICE AND METHOD OF FABRICATING THE SAME

CROSS-REFERENCE TO RELATED APPLICATIONS

This application is a divisional of U.S. patent application Ser. No. 12/713,846, filed on Feb. 26, 2010, and claims priority from and the benefit of Korean Patent Application No. 10-2009-0018200, filed on Mar. 3, 2009, the disclosures of which are incorporated herein by reference.

BACKGROUND OF THE INVENTION

1. Field of the Invention

Aspects of the present invention relate to an organic light emitting diode (OLED) display device and a method of fabricating the same, and more particularly, to an OLED display device including a capacitor whose capacitance is increased using a method of fabricating a polysilicon layer using a metal catalyst and a method of fabricating the same.

2. Description of the Related Art

In general, polysilicon is widely used as a semiconductor layer of a thin film transistor due to its high field effect mobility and applicability to high-speed operating circuits and complementary metal-oxide-semiconductor (CMOS) circuits. The thin film transistors having a polysilicon layer are generally used as active elements of active matrix liquid crystal displays (AMLCDs), and switching elements and driving elements of organic light emitting diodes (OLEDs).

Here, methods of crystallizing an amorphous silicon layer into the polysilicon layer used for a thin film transistor include a solid phase crystallization (SPC) method, an excimer laser crystallization (ELC) method, a metal induced crystallization (MIC) method, and a metal induced lateral crystallization (MILC) method. In the SPC method, an amorphous silicon layer is annealed at a temperature of about 700° C. or less, i.e., a transition temperature of a glass substrate of a display device for several hours to several tens of hours. In the ELC method, an excimer laser is irradiated on an amorphous silicon layer to locally heat the irradiated portion to a high temperature for a very short time period, so that the amorphous silicon layer is crystallized. In the MIC method, metals such as nickel, palladium, gold, aluminum, etc., are placed in contact with or injected into an amorphous silicon layer, so that the amorphous silicon layer is changed into a polysilicon layer, i.e., a phase change of the amorphous silicon is induced by the metal. In the MILC method, silicide, which is produced by reacting metal with silicon, is laterally and continuously diffused to sequentially induce crystallization of the amorphous silicon layer.

However, the SPC method requires a long time, and the annealing process is performed at a high temperature for a long time, which may deform a substrate. Also, in the ELC method, a high-priced laser device is required, and protrusions may be formed on the polycrystalline surface such that interfacial characteristics between a semiconductor layer and a gate insulating layer may deteriorate.

Currently, research into methods of crystallizing an amorphous silicon layer using a metal is actively progressing because crystallization can be achieved at a lower temperature and with less time than the SPC method. The methods of crystallizing an amorphous silicon layer using a metal include the MIC method, the MILC method, and a super grain silicon crystallization method.

Meanwhile, in an OLED, capacitors are formed, and a capacitor having a high capacitance may be advantageous to the operation of the OLED. Thus, research into increasing the capacitance of the capacitor is required.

SUMMARY OF THE INVENTION

Aspects of the present invention provide an organic light emitting diode (OLED) display device in which capacitance of a capacitor is increased by increasing a surface area of the capacitor in a simple manner and a method of fabricating the same.

According to aspects of the present invention, an OLED display device includes: a substrate having a thin film transistor region and a capacitor region; a buffer layer disposed on the substrate; a patterned semiconductor layer disposed on the buffer layer in the thin film transistor region; a gate insulating layer disposed on the substrate to cover the patterned semiconductor layer; a gate electrode disposed on the gate insulating layer and facing a predetermined region of the patterned semiconductor layer; a lower capacitor electrode disposed on the gate insulating layer in the capacitor region; an interlayer insulating layer disposed on the substrate to cover the gate electrode and the lower capacitor electrode; source and drain electrodes disposed on the interlayer insulating layer and electrically connected to the patterned semiconductor layer, and an upper capacitor electrode disposed on the interlayer insulating layer and facing the lower capacitor electrode; a first electrode disposed on the interlayer insulating layer and electrically connected to one of the source and drain electrodes; an organic layer including a light emitting layer, the organic layer being disposed on the first electrode; and a second electrode disposed on the organic layer, wherein regions of each of the buffer layer, the gate insulating layer, the interlayer insulating layer, the lower capacitor electrode, and the upper capacitor electrode that are disposed in the capacitor region of the substrate have surfaces in which protrusions are formed, the protrusions following the shape of grain boundaries of the patterned semiconductor layer.

According to aspects of the present invention, a method of fabricating an organic light emitting diode (OLED) display device includes: forming a substrate having a thin film transistor region and a capacitor region; forming a buffer layer on the substrate; forming an amorphous silicon layer on the buffer layer; forming a metal catalyst layer on the amorphous silicon layer; annealing the substrate to crystallize the amorphous silicon layer into a polysilicon layer; removing the metal catalyst layer; forming protrusions in the buffer layer while patterning the polysilicon layer to form a semiconductor layer in the thin film transistor region; forming a gate insulating layer on the substrate to cover the semiconductor layer; forming a gate electrode on the gate insulating layer and facing a predetermined region of the semiconductor layer; forming a lower capacitor electrode on the gate insulating layer in the capacitor region; forming an interlayer insulating layer on the substrate to cover the gate electrode and the lower capacitor electrode; forming source and drain electrodes on the interlayer insulating layer which are electrically connected to the semiconductor layer; forming an upper capacitor electrode on the interlayer insulating layer and facing the lower electrode; forming a first electrode on the interlayer insulating layer which is electrically connected to one of the source and drain regions of the semiconductor layer; forming an organic layer including a light emitting layer on the first electrode; and forming a second electrode on the organic layer.

According to aspects of the present invention, an OLED display device includes: a substrate having a thin film transistor region and a capacitor region; a buffer layer disposed on the substrate, the buffer layer having protrusions in the capacitor region that extend therefrom away from the substrate; and a capacitor disposed on the buffer layer in the capacitor region, wherein the capacitor follows the shape of the protrusions of the buffer layer.

According to aspects of the present invention, a method of manufacturing an organic light emitting diode (OLED) display device includes: forming a substrate having a thin film transistor region and a capacitor region; forming a buffer layer on the substrate; forming an amorphous silicon layer on the buffer layer; crystallizing the amorphous silicon layer to form a polysilicon layer having grain boundaries; forming protrusions in portions of the buffer layer adjacent to the grain boundaries of the polysilicon layer while patterning the polysilicon layer to form a semiconductor layer, the semiconductor layer being disposed in the thin film transistor region; forming a lower capacitor electrode on the gate insulating layer in the capacitor region, the lower capacitor electrode having protrusions corresponding to the protrusions of the buffer layer; forming an interlayer insulating layer on the substrate to cover at least the lower capacitor electrode, the interlayer insulating layer having protrusions corresponding to the protrusions of the lower capacitor electrode; and forming an upper capacitor electrode on the interlayer insulating layer and facing the lower electrode, the upper capacitor electrode having protrusions corresponding to the protrusions of the interlayer insulating layer.

According to aspects of the present invention: a method of manufacturing an organic light emitting diode (OLED) display device includes: forming a buffer layer on a substrate; forming protrusions in portions of the buffer layer; forming a lower capacitor electrode on the gate insulating layer, the lower capacitor electrode having protrusions corresponding to the protrusions of the buffer layer; forming an interlayer insulating layer on the substrate to cover at least the lower capacitor electrode, the interlayer insulating layer having protrusions corresponding to the protrusions of the lower capacitor electrode; and forming an upper capacitor electrode on the interlayer insulating layer and facing the lower electrode, the upper capacitor electrode having protrusions corresponding to the protrusions of the interlayer insulating layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1A to 1G illustrate manufacture of an organic light emitting diode (OLED) display device according to an exemplary embodiment of the present invention.

DETAILED DESCRIPTION OF THE EMBODIMENTS

Figure 1A:
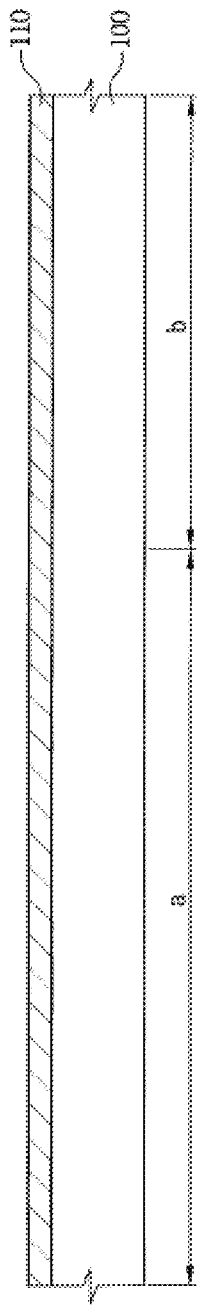

Reference will now be made in detail to the present embodiments of the present invention, examples of which are illustrated in the accompanying drawings, wherein like reference numerals refer to the like elements throughout. The embodiments are described below in order to explain the present invention by referring to the figures. In the drawings, the sizes and proportions of layers/regions may be exaggerated, and like reference numerals refer to like elements. It will be understood that when an element such as a layer, film, region, or substrate is referred to as being "formed on" or "disposed on" another element, it can be disposed directly on the other element, or intervening elements may also be present. In contrast, when an element is referred to as being "formed directly on" or "disposed directly on" another element, there are no intervening elements present.

FIGS. 1A to 1G illustrate the manufacture of an organic light emitting diode (OLED) display device according to an exemplary embodiment of the present invention. Referring to FIG. 1A, a substrate 100 including a thin film transistor region a and a capacitor region b is prepared, and a buffer layer 110 is formed on the substrate 100. The substrate 100 may be formed of glass or plastic, and the buffer layer 110 may be formed of a single insulating layer, such as one of a silicon oxide layer and a silicon nitride layer, or a stacked layer thereof, using a chemical vapor deposition (CVD) method or a physical vapor deposition (PVD) method. Here, the buffer layer 110 may function to prevent the diffusion of moisture or impurities from the substrate 100 or to adjust a heat transfer rate in crystallization to facilitate crystallization of a later-formed amorphous silicon layer.

Figure 1B:
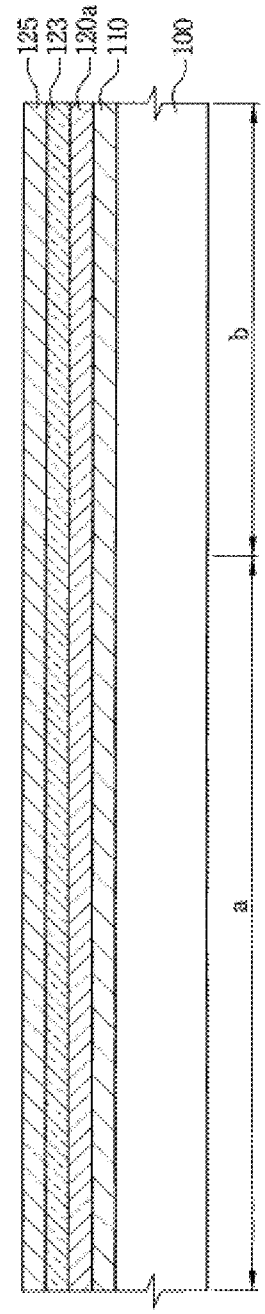

Next, referring to FIG. 1B, an amorphous silicon layer 120a is formed on the buffer layer 110. Then, a diffusion layer 123 and a metal catalyst layer 125 are formed on the amorphous silicon layer 120a. Here, the amorphous silicon layer 120a may be formed by a CVD or PVD method. Further, when the amorphous silicon layer 120a is formed or after the amorphous silicon layer 120a is formed, a dehydrogenation process may be performed to lower the concentration of hydrogen. The diffusion layer 123 may be formed of a silicon nitride layer through which a metal catalyst to be formed in the following process can be diffused in an annealing process, and may be formed of a stacked layer of a silicon nitride layer and a silicon oxide layer. The diffusion layer 123 may be formed by a CVD or PVD method. Here, the diffusion layer 123 may be formed to a thickness of 1 Å to 2000 Å. When the diffusion layer 123 is formed to a thickness less than 1 Å, the diffusion layer 123 may not sufficiently control the amount of metal catalyst diffused therethrough. When the thickness of the diffusion layer 123 exceeds 2000 Å, the amount of metal catalyst that diffuses to the amorphous silicon layer 120a is small, and thus it may be difficult to crystallize the amorphous silicon layer into a polysilicon layer.

A metal catalyst is deposited on the diffusion layer 123 to form the metal catalyst layer 125. Here, one selected from the group consisting of Ni, Pd, Ag, Au, Al, Sn, Sb, Cu, Tb, and Cd. For example, nickel (Ni) may be used as the metal catalyst. Here, the metal catalyst layer 125 may be formed with an areal density of $10^{11}$ atoms/cm$^2$ to $10^{15}$ atoms/cm$^2$ on the diffusion layer 123. When the metal catalyst is formed with an areal density less than $10^{11}$ atoms/cm$^2$, the amount of seeds that are crystallization nuclei is small, and thus the amorphous silicon layer may not be crystallized into a polysilicon layer using a super grain silicon (SGS) method. Alternatively, when the metal catalyst is formed with an areal density greater than $10^{15}$ atoms/cm$^2$, the amount of metal catalyst diffused into the amorphous silicon layer is great, and thus grains of a resultant polysilicon layer are small. Furthermore, as the amount of remaining metal catalyst increases in the resultant polysilicon layer, characteristics of a semiconductor layer formed by patterning the polysilicon layer deteriorate.

As described above, an annealing process is performed on the substrate 100 on which the buffer layer 110, the amorphous silicon layer 120a, the diffusion layer 123, and the metal catalyst layer 125 are formed to move at least a portion of the metal catalyst of the metal catalyst layer 125 to a surface of the amorphous silicon layer 120a. That is, only a small amount of metal catalyst diffuses through the diffusion layer 123 to the surface of the amorphous silicon layer 120a, and most of the metal catalyst does not reach the amorphous silicon layer 120a or pass through the diffusion layer 123.

Therefore, the amount of metal catalyst reaching the surface of the amorphous silicon layer 120a is determined depending on a diffusion blocking ability of the diffusion layer 123, and the diffusion blocking ability of the diffusion layer 123 is closely related to the thickness of the diffusion layer 123. For example, as the diffusion layer 123 becomes thicker, the amount of metal catalyst to be diffused is reduced, and thus the grain size is increased. Moreover, as the diffusion layer becomes thinner, the amount of metal catalyst to be diffused is increased, and thus the grain size is reduced.

Here, the annealing process may be performed at a temperature of 200° C. to 900° C., for example, 350° C. to 500° C. for several seconds to several hours to diffuse the metal catalyst of the metal catalyst layer 125 to the amorphous silicon layer 120a. When the annealing process is performed at such a temperature for such a time period, deformation of a substrate caused by an excessive annealing process can be prevented to increase manufacturing yield and to reduce manufacturing costs. The annealing process may be performed using one of a furnace process, a rapid thermal annealing (RTA) process, an UV process, and a laser process (i.e., any of these processes).

After the amorphous silicon layer 120a is crystallized into the polysilicon layer, the diffusion layer 123 and the metal catalyst layer 125 are removed. Referring to FIG. 1C, the amorphous silicon layer 120a crystallized into the polysilicon layer is patterned to form a semiconductor layer 120. Here, the semiconductor layer may be patterned using dry etching.

When the polysilicon layer is patterned into the semiconductor layer 120 using dry etching, grain boundaries on which metal silicides of the polysilicon layer crystallized by the metal catalyst gather and a seed region are not completely removed from the surface of the etched buffer layer and remain as a protrusion A. Therefore, the protrusion A remaining on the buffer layer 110 is formed in the same shape as a grain boundary that is formed by crystallizing the amorphous silicon layer into the polysilicon layer. In addition, when the grain size of the semiconductor layer 120 formed of the polysilicon layer is great, the frequency of the protrusions A on the buffer layer is reduced, and when the grain size is small, the frequency of the protrusions A is increased.

Figure 2:
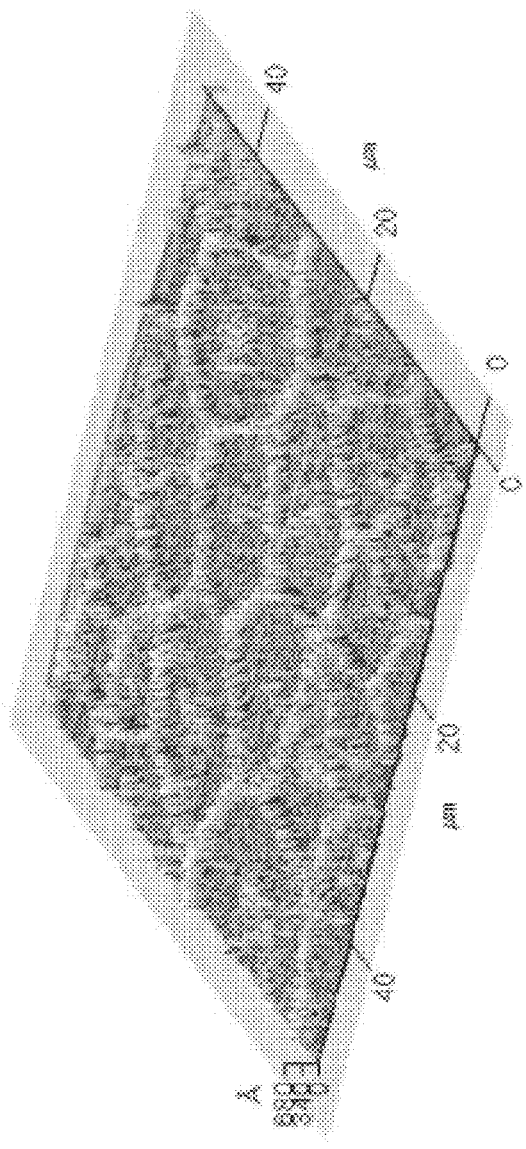
FIG. 2 is a photograph showing a surface of a buffer layer from which a polysilicon layer is removed according to an exemplary embodiment of the present invention.

FIG. 2 is a photograph showing a surface of a buffer layer after a polysilicon layer crystallized by a metal catalyst is removed by dry etching. Referring to FIG. 2, a protrusion formed to a thickness of 0 Å to 640 Å or less is observed on the buffer layer 110, and a step difference of the protrusion may vary depending on crystallization condition and thickness of the removed polysilicon layer.

Referring to FIG. 1D, a gate insulating layer 130 is formed on the surface of the substrate 100 on which the semiconductor layer 120 is formed. The gate insulating layer 130 is formed to cover at least a portion of the semiconductor layer 120 to insulate the semiconductor layer 120 from a later formed gate electrode or may be formed on the entire surface of the substrate 100 to cover the semiconductor layer 120. The gate insulating layer 130 may be formed of a silicon oxide layer, a silicon nitride layer or a combination thereof, and the protrusions A of the buffer layer causes the gate insulating layer 130 and the lower capacitor electrode 145 to have protrusions A in the same shape.

Afterwards, a single layer of aluminum (Al) or an aluminum alloy, such as aluminum-neodymium (Al—Nd), or a multilayer in which an aluminum alloy is stacked on a chromium (Cr) or molybdenum (Mo) alloy is used to form a metal layer for a gate electrode (not shown). Then, the metal layer for a gate electrode is etched using photolithography and etching to form a gate electrode 140 facing the semiconductor layer 120 in the thin film transistor region a at a predetermined region of the semiconductor layer 120, i.e., a channel region thereof, and a lower capacitor electrode 145 in the capacitor region b.

Therefore, the protrusions are formed on the lower capacitor electrode 145, and thus a surface area of the electrode is increased. As a result, the increased surface area causes a capacitance of the capacitor to be increased when the capacitor is completely formed.

Figure 1E:
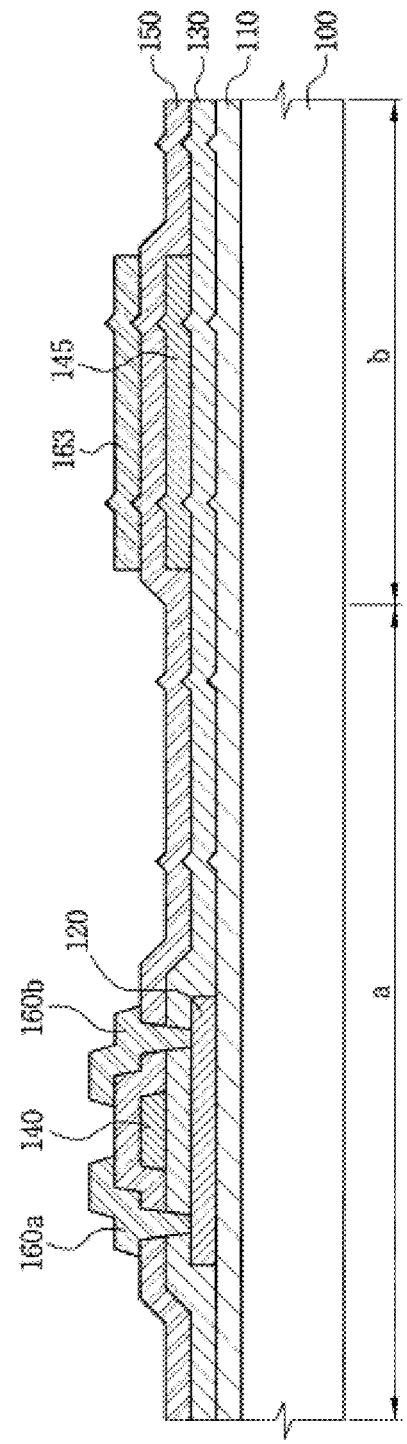

Referring to FIG. 1E, an interlayer insulating layer 150 is formed on the surface of the substrate 100 on which the gate electrode 140 and the lower capacitor electrode 145 are formed. The interlayer insulating layer 150 may be formed to cover the entire surface of the substrate 100, including the gate electrode 140 and the lower capacitor electrode 145, or may be formed to cover at least a portion of each of the gate electrode 140 and the lower capacitor electrode 145. Afterwards, a metal layer for source and drain electrodes (not shown) is formed on the surface of the interlayer insulating layer and then patterned, so that source and drain electrodes 160a and 160b disposed in the thin film transistor region a and electrically connected to the semiconductor layer 120, and an upper capacitor electrode 163 disposed on the capacitor region b and facing the lower electrode 145 are formed. The source and drain electrodes 160a and 160b are electrically connected to source and drain regions of the semiconductor layer 120 via through holes formed in the interlayer insulating layer 150 and the gate insulating layer 130. Further, because the lower capacitor electrode 145 and the upper capacitor electrode 163 follow the shape of the protrusions A of the buffer layer 110 and have an increased area, the capacitance of the resultant capacitor is increased.

The interlayer insulating layer 150 may be formed of a silicon nitride layer, a silicon oxide layer, or a combination thereof. Also, the source and drain electrodes 160a and 160b and the upper capacitor electrode 163 may be formed of one selected from the group consisting of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a Cu alloy.

Figure 1F:
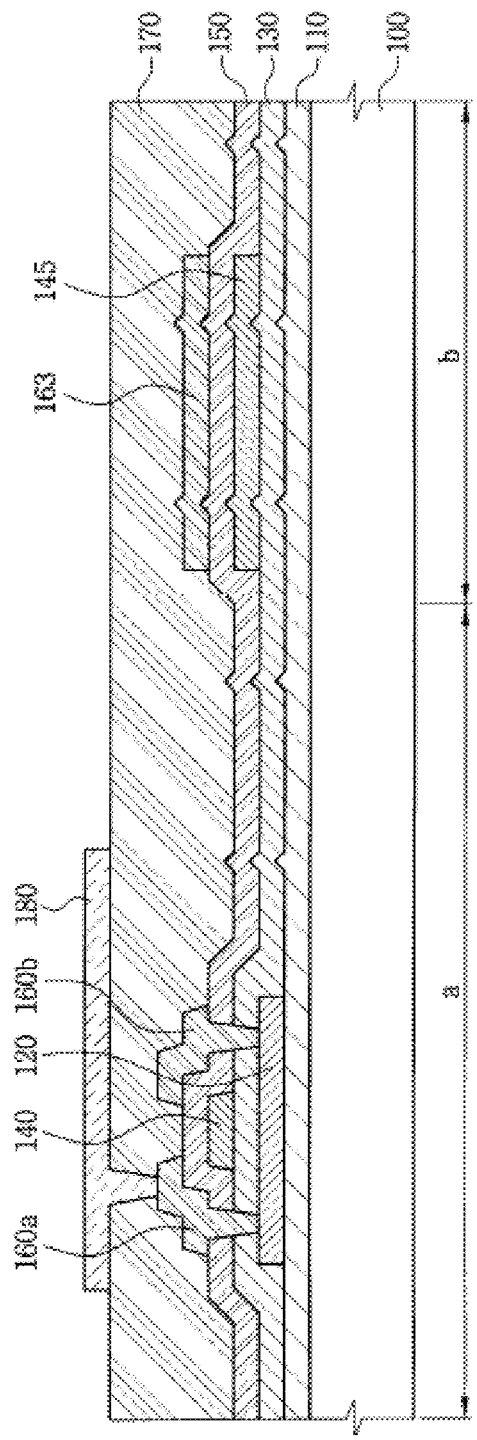

Afterwards, referring to FIG. 1F, after a protection layer 170 is formed on the entire surface of the substrate, a first electrode 180 connected to one of the source and drain electrodes 160a and 160b of the thin film transistor region a is formed on the protection layer 170. The first electrode 180 is connected to the one of the source and drain electrodes 160a and 160b via a through hole formed in the protective layer 170.

The first electrode 180 may be formed as an anode or a cathode. When the first electrode 180 is formed as an anode, the anode may be formed of a transparent conductive layer made of ITO, IZO or ITZO; and when the first electrode 180 is formed as a cathode, the cathode may be formed of Mg, Ca, Al, Ag, Ba, or alloys thereof.

Figure 1G:
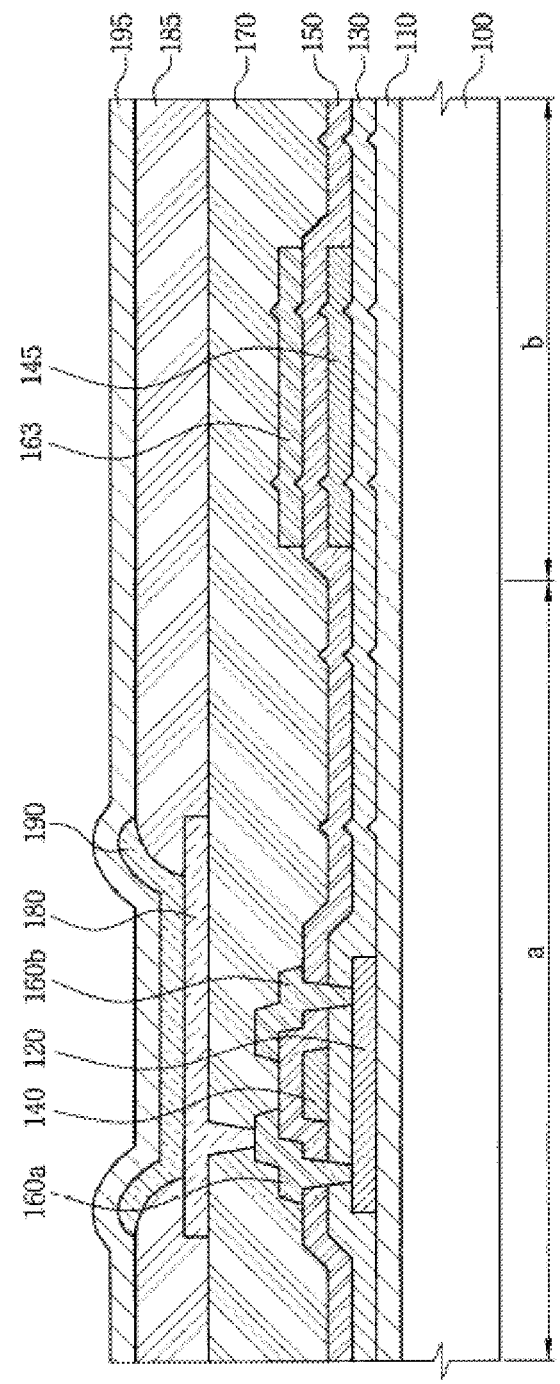

Referring to FIG. 1G, a pixel defining layer 185 having an opening to at least partially expose the first electrode 180 is formed on the protective layer 170. The pixel defining layer 185 may also be formed to cover at least a portion of the first electrode 180. An organic layer 190, including a light emitting layer, is formed on the exposed first electrode 180. The organic layer 190 may comprise a hole injection layer, a hole transport layer, a hole blocking layer, an electron blocking layer, an electron injection layer, and an electron transport layer. A second electrode 195 is formed on the organic layer 190. As a result, the OLED display device according to an example embodiment of the present invention is completed.

While a polysilicon layer crystallized using a SGS method is described, MILC and MIC methods in which crystallization is performed using a metal catalyst can be used as the method of crystallizing the amorphous silicon layer, and the methods may be used alone or in combination.

According to aspects of the present invention, an amorphous silicon layer is crystallized using a metal catalyst to form a semiconductor layer formed of a polysilicon layer. Further, protrusions that are formed by residual metals remaining in the silicon layer upon crystallization on a buffer layer in the form of metal silicides cause a surface area of the buffer layer to be increased. As a result, an OLED display device may have a capacitor formed on the buffer layer whose capacitance is increased.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display device, comprising:
   a substrate having a thin film transistor region and a capacitor region;
   a buffer layer disposed on the substrate;
   a patterned semiconductor layer disposed on the buffer layer in the thin film transistor region of the substrate;
   a gate insulating layer disposed on the substrate to cover the patterned semiconductor layer;
   a gate electrode disposed on the gate insulating layer and facing a predetermined region of the patterned semiconductor layer;
   a lower capacitor electrode disposed on the gate insulating layer in the capacitor region;
   an interlayer insulating layer disposed on the substrate to cover the gate electrode and the lower capacitor electrode;
   source and drain electrodes disposed on the interlayer insulating layer and electrically connected to the patterned semiconductor layer;
   an upper capacitor electrode disposed on the interlayer insulating layer and facing the lower capacitor electrode;
   a first electrode disposed on the interlayer insulating layer and electrically connected to one of the source and drain electrodes;
   an organic layer disposed on the first electrode, the organic layer including a light emitting layer; and
   a second electrode disposed on the organic layer,
   wherein a region of the buffer layer corresponding to the capacitor region of the substrate, a region of the gate insulating layer corresponding to the capacitor region of the substrate, a region of the interlayer insulating layer corresponding to the capacitor region of the substrate, a region of the lower capacitor electrode corresponding to the capacitor region of the substrate, and a region of the upper capacitor electrode corresponding to the capacitor region of the substrate each has a surface on which protrusions are formed, the protrusions following a shape of grain boundaries of the patterned semiconductor layer.

2. The device of claim 1, wherein the gate electrode is formed of one of a single layer of aluminum (Al), a single layer of an aluminum (Al) alloy, a multilayer of a chromium (Cr) alloy and an aluminum (Al) alloy, and a multilayer of a molybdenum (Mo) alloy and an aluminum (Al) alloy.

3. The device of claim 1, wherein the lower capacitor electrode is formed of a same material as the gate electrode.

4. The device of claim 1, wherein the protrusions are disposed in the buffer layer except for a portion of the buffer layer on which the semiconductor layer is formed.

5. The device of claim 1, wherein the buffer layer is formed of a silicon oxide layer, a silicon nitride layer, or a stacked layer thereof.

6. The device of claim 1,
   wherein the buffer layer comprises metal silicides, and
   wherein the buffer layer has a higher concentration of the metal silicides near the protrusions, as compared with other portions of the buffer layer.

7. The device of claim 1, wherein the upper capacitor electrode is formed of a same material as the source and drain electrodes.

8. The device of claim 1, wherein the upper capacitor electrode is formed of one selected from the group consisting of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a Mo alloy, an Al alloy, and a Cu alloy.

9. The device of claim 1, wherein, when a grain size of the semiconductor layer is decreased, the buffer layer has more protrusions.

10. The device of claim 1, wherein the protrusions are further formed where seeds of crystallization of the patterned semiconductor layer were disposed before the patterned semiconductor layer was patterned.

11. An organic light emitting diode (OLED) display device, comprising:
    a substrate having a thin film transistor region and a capacitor region;
    a buffer layer disposed on the substrate;
    a patterned semiconductor layer disposed on the buffer layer in the thin film transistor region of the substrate; and
    a capacitor disposed on the buffer layer in the capacitor region,
    wherein the buffer layer comprises protrusions disposed in the capacitor region,
    wherein the capacitor follows a shape of the protrusions of the buffer layer, and
    wherein the protrusions extend in a direction away from the substrate and follow the shape of grain boundaries of the patterned semiconductor layer.

12. The OLED display device of claim 11, wherein the protrusions extend to a height of 680 Å or less from a surface of the buffer layer.

13. The OLED display device of claim 11, further comprising:
    a semiconductor layer disposed on the buffer layer in the thin film transistor region, wherein the protrusions are formed in the buffer layer except for a portion of the buffer layer on which the semiconductor layer is formed.

14. The OLED display device of claim 11, wherein the capacitor comprises:
   a first electrode disposed on the buffer layer;
   an interlayer insulating layer disposed on the first electrode; and
   a second electrode disposed on the interlayer insulating layer,
   wherein the first electrode and the second electrode follow the shape of the protrusions of the buffer layer.

15. The OLED display device of claim 11, further comprising a gate insulating layer disposed on the buffer layer between the buffer layer and the capacitor.

16. The OLED display device of claim 11,
   wherein the buffer layer comprises metal silicides, and
   wherein the buffer layer has a higher concentration of the metal silicides near the protrusions, as compared with other portions of the buffer layer.

* * * * *